United States Patent [19]
Ando

[11] Patent Number: 4,825,064
[45] Date of Patent: Apr. 25, 1989

[54] APPARATUS FOR ENERGIZING A SEMICONDUCTOR LASER ARRAY HAVING A PLURALITY OF LIGHT BEAM EMITTING POINTS

[75] Inventor: Hideo Ando, Kawasaki, Japan
[73] Assignee: Kabushiki Kaisha Toshiba, Kawasaki, Japan
[21] Appl. No.: 18,493
[22] Filed: Feb. 25, 1987
[30] Foreign Application Priority Data
Feb. 26, 1986 [JP] Japan .................................. 61-40710
[51] Int. Cl.$^4$ ............................................... G01J 1/32
[52] U.S. Cl. .................................... 250/205; 250/201; 369/45
[58] Field of Search ................. 250/201 DF, 205, 202; 369/44-46

[56] References Cited
U.S. PATENT DOCUMENTS

| | | | |
|---|---|---|---|
| 4,507,763 | 3/1985 | Kato | 369/46 |
| 4,546,463 | 10/1985 | Opheij et al. | 369/46 |
| 4,660,189 | 4/1987 | Tsukamura et al. | 250/205 |
| 4,663,751 | 5/1987 | Kaku et al. | 369/46 |
| 4,667,316 | 5/1987 | Suda et al. | 250/201 |

Primary Examiner—Edward P. Westin
Assistant Examiner—Khaled Shami
Attorney, Agent, or Firm—Finnegan, Henderson, Farabow, Garrett, & Dunner

[57] ABSTRACT

In an apparatus for energizing a semiconductor laser array, the semiconductor laser array has first and second laser structures. The first laser beam emitted from the first laser structure is detected and is converted into a first photoelectric signal by a first photodetecting region of a detector. The first photoelectric signal is compared with a first reference signal by a first subtracter and a first comparison signal is outputted from the first subtracter. A first energizing signal for energizing the first semiconductor structure is determined by a first energizing circuit in accordance with the first comparison signal so that the first laser beam is maintained in a predetermined intensity level. The second laser beam emitted from the second laser structure is also detected by a second photodetecting region of the detector and is converted into a second photoelectric signal. The photoelectric signal is also compared by a second subtracter which outputs a second comparison signal. A second energizing signal for energizing the second semiconductor structure is determined by a second energizing circuit in accordance with the second comparison signal so that the second laser beam is maintained in a predetermined level.

7 Claims, 8 Drawing Sheets

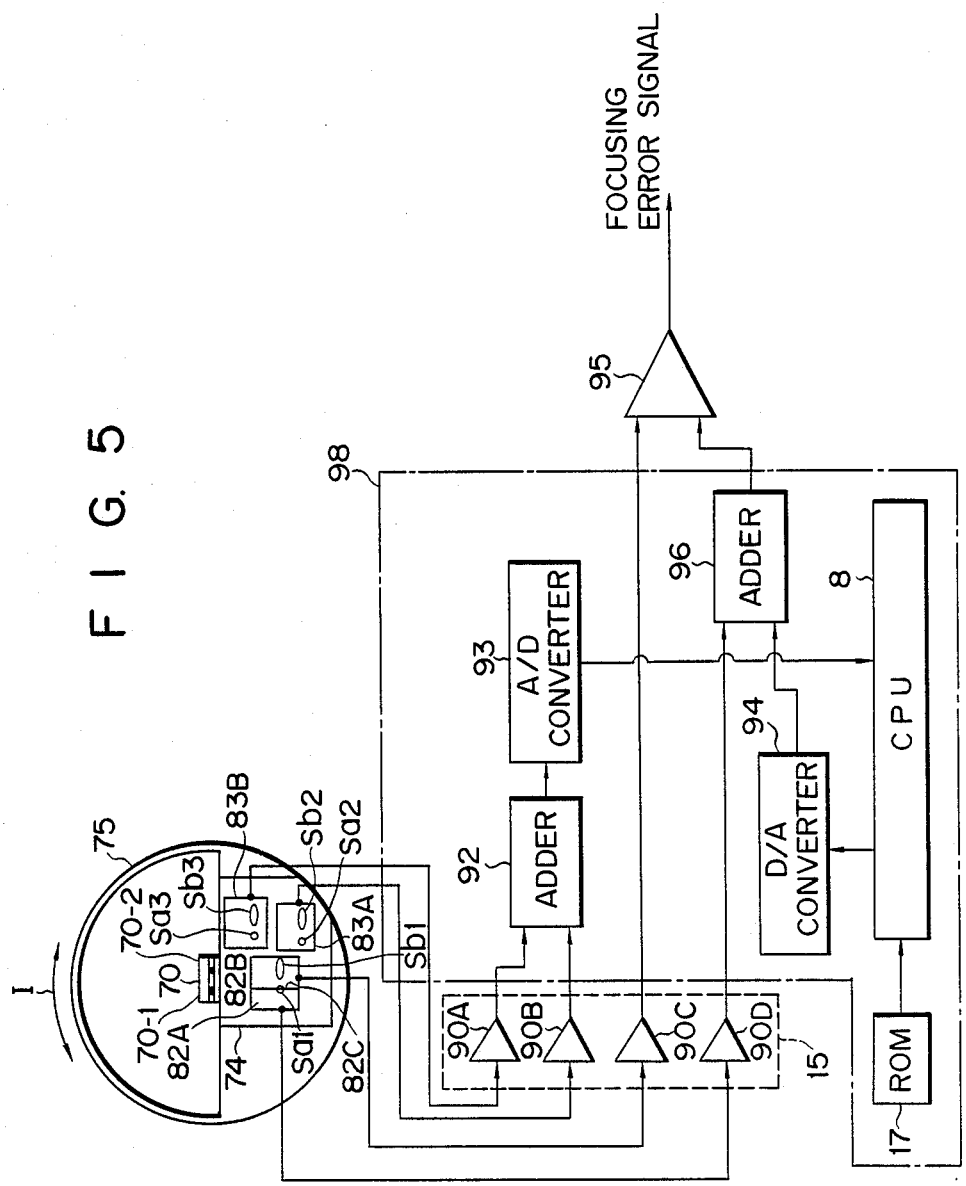
F I G. 5

APPARATUS FOR ENERGIZING A SEMICONDUCTOR LASER ARRAY HAVING A PLURALITY OF LIGHT BEAM EMITTING POINTS

BACKGROUND OF THE INVENTION

This invention relates to an apparatus for energizing a semiconductor laser array having a plurality of light beam emitting points and, in particular, to an apparatus for energizing a semiconductor laser array used in an information retrieving system having an optical memory on which light beams are converged, and controlling the laser beams emitted from the semiconductor laser array.

An information retrieving system is known in the art which, with the use of a plurality of light beams reflected from an optical memory on which they are initially converged, retrieves information recorded on the optical memory. This type of information retrieving system is known, for example, in U.S. Pat. Nos. 673,764; 705,305; and 713,598, filed on Nov. 21, 1984; Feb. 25, 1984; and Mar. 19, 1985, respectively. The information retrieving system may be of a read-while-erase type, a write-after-erase type, read-while-write type or a write-while-read type. In this case, a semiconductor laser is used as a light source for the information retrieving system and, in recent times, a semiconductor laser array has been developed having a plurality of laser structures and of light emitting points. This semiconductor laser array has been studied for the possibility of being used as a light source. Since, however, the semiconductor laser array of such type includes a close proximity array of laser structures as well as a close proximity array of light beam emitting points, if laser beams are emitted from the light beam emitting points through the energization of the laser structures, cross-talking occurs among the laser beams at which time an unstable beam or beams emerge from the light beam emitting points and may sometimes be oscillated. Furthermore, even if the ambient temperature around the semiconductor laser array varies, problems also occur because of a variation in the operation characteristics of the laser structures and because the beam or beams emitting from the light beam emitting points vary depending upon the ambient temperature.

SUMMARY OF THE INVENTION

It is accordingly an object of this invention to provide an apparatus for energizing a semiconductor laser array to generate laser beams from a plurality of light beam emitting points in the semiconductor laser array. According to the invention, there is provided means for generating first and second light beams, means for detecting the first and second light beams, said detecting means having a first detecting region receiving the first light beam and converting it to first electric signal and a second detecting region receiving the second light beam and converting it to second electric signal, means for receiving the first and second electric signals from said detecting means and for generating first and second energizing signals in accordance with the respective electric signals, and means for controlling the intensities of the first and second light beams at predetermined levels in accordance with the first and second energizing signals.

BRIEF DESCRIPTION OF THE DRAWINGS

FIG. 5 is a block diagram showing a circuit arrangement of a focusing signal generator of FIG. 1;

DETAILED DESCRIPTION OF THE PREFERRED EMBODIMENTS

An information retrieving, recording and erasing system will now be explained below in connection with a preferred embodiment of this invention which energizes a semi-conductor laser array having a plurality of light beam emitting points.

Figure 1:
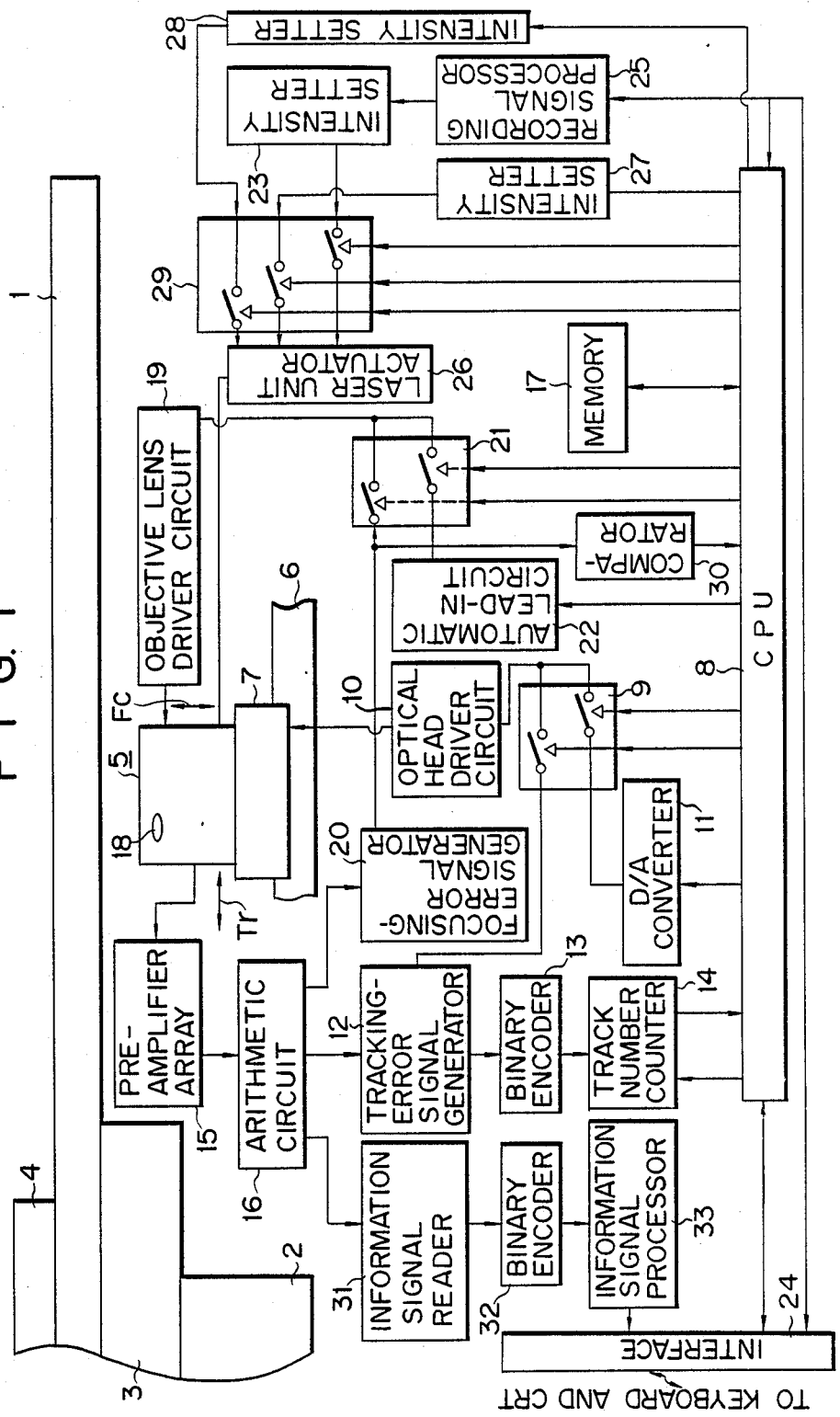
FIG. 1 is a block diagram showing an information recording and reproduction system incorporating a preferred embodiment of this invention for energizing a semiconductor laser.
Figure 2:
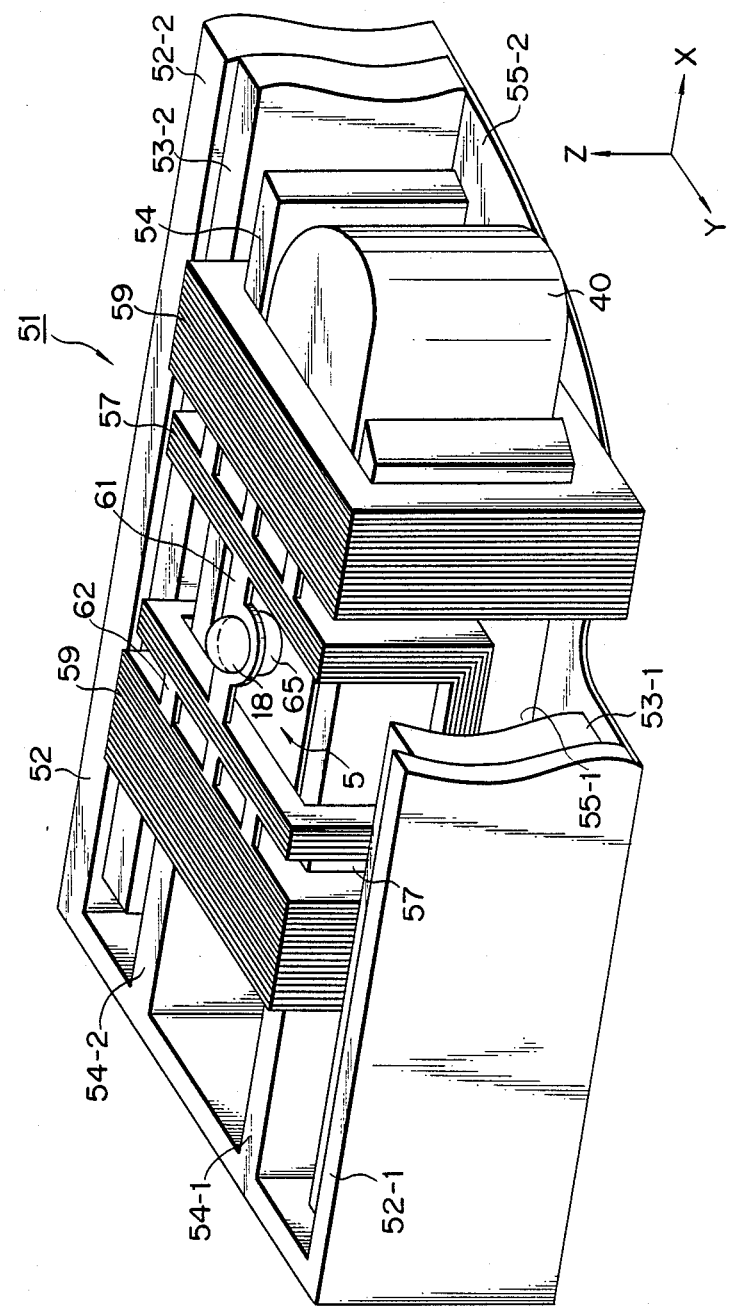
FIG. 2 is a perspective view schematically showing a mechanism for driving an optical head shown in FIG. 1.

As shown in FIG. 1, an optical memory, e.g., optical disk 1, is mounted on turntable 3, which is rotated by driving shaft 2. Clamper 4 is disposed on disk 1 to hold the disk against turntable 3. Disk 1 has a record layer at least on its one side. Information can be recorded on or retrieved from the record layer. The layer is formed with a spiral or concentric tracking guide. Provided under disk 1 is optical head 5, which includes an optical system as shown in FIG. 2. Head 5 is mounted on carrier block 7, which is disposed within a guide frame 6 so as to be slidable in the radial direction of disk 1.

In the access mode, CPU 8 receives an access program from memory 17 for moving optical head 5 to access the tracking guide. Then, CPU 8 delivers an access mode signal to analog switch unit 9, whereby it is connected to optical-head driver circuit 10 through D/A converter 11. CPU 8 also supplies an access signal to optical head driver circuit 10 through D/A converter 11 so that circuit 10 is actuated. Circuit 10 delivers a drive signal to a head driving coil (not shown). As a result, head 5 is transported in the direction of arrow Tr along guide frame 6. In the access mode, the tracking guides are counted, starting from a predetermined position or a previously accessed tracking guide. Thus, the tracking guides are recognized one after another. In other words, output signals from tracking-error signal generator 12 are binary-coded by binary encoder 13, which generates one pulse each time head 5 crosses one tracking guide. The pulses, and hence the tracking guides, are counted by track number counter 14. CPU 8 delivers the tracking mode signal to analog switch unit 9 to change the operation mode from the access mode to the tracking mode, whereupon counter 14 in which a maximum number to be counted is preset by CPU 8 in the access mode, generates a stop signal to stop the access movement of optical head 5 after the end of access. Switch unit 9 connects tracking-error signal generator 12 to optical head driver circuit 10, in response to the tracking mode signal. Thus, the correction of a tracking-error is started. Photoelectric signals delivered from a photodetector of head 5 are amplified by preamplifier array 15, and processed by arithmetic circuit 16, including adders and other elements. The processed signals are supplied to signal generator 12, whereupon generator 12 delivers a tracking-error signal. The tracking-error signal is supplied through analog switch unit 9 to driver circuit 10 for moving optical head 5. As a result, head 5 is moved, thus correcting the tracking-error. If objective lens 18 is in the defocusing state, head 5 is moved in the direction of arrow Fc by objective-lens driver circuit 19, in response to a focusing-error signal from focusing-error signal generator 20. Thereupon, lens 18 is kept in the focusing state. Immediately before the focusing servo loop is closed, switch unit 21 is shifted so that objective lens driver circuit 19 is connected to automatic lead-in circuit 22. As a result, circuit 19 is actuated so that objective lens 18 is returned to its initial position.

Recording beam intensity setter 23 is supplied with a recording signal from an external device via interface 24 and recording signal processor 25 for generating a recording signal. The recording signal is responsive to information data to be stored in the optical memory, and an actuating signal, corresponding to the recording signal, is supplied to laser array of head 5 from laser unit actuator 26 so that a recording laser beam is emitted from laser array. In response to a command supplied externally through interface 24, a retrieving-mode signal is delivered from retrieving beam intensity setter 27 so that an actuating signal is supplied to laser array from actuator 26. Also, an erasing mode signal is delivered from erasing beam intensity setter 28 in response to the command so that an actuating signal is supplied to laser array 11 from actuator 26. Analog switch unit 29 is shifted in response to commands for individual modes from CPU 8, so that the corresponding signals are supplied to laser unit actuator 26.

In an erasing mode, when the amount of defocus increases above a predetermined value, the erasing laser beam disappears. That is, when the focusing-error signal from focusing-error signal generator 20 reaches a predetermined level, a high-level signal is generated from comparator 30 connected to focusing-error signal generator 20, and a command for suspending the erasing mode is supplied from CPU 8 to analog switch unit 29 so that the erasing laser is deenergized. When the focusing-error signal again regains a level below the predetermined level, a low-level signal is generated from comparator 30 connected to focusing-error signal generator 20. A command for regaining the erasing mode is supplied from CPU 8 to switch unit 21, thus energizing the erasing laser. As a result, information is prevented from being erroneously erased for the case where a greater amount of defocus is involved for the objective lens.

The signals processed by arithmetic circuit 16 are read by information signal reader 31 and binary-coded by binary encoder 32. Then, the signals are supplied to information signal processor 33 for modulation and demodulation of information signals and for error correction. Thereupon, the signals are converted into a regenerative signal which is delivered to the external device, for example, a CRT, through interface 24.

Optical head 5 is incorporated, for example, in drive mechanism 51, as shown in FIG. 2. Thus, head 5 is driven by mechanism 51. In mechanism 51, guide frame 6, made of permeable material, is fixed in box-shaped yoke 52. Frame 6 is formed of two parallel guide yokes 54-1, 54-2 acting as guide rails, extending in the X-direction of FIG. 2. Plate-shaped permanent magnets 53-1, 53-2 are arranged between guide yokes 54-1, 54-2 and elongated yoke sections 52-1, 52-2 of yoke 52, in the Y-direction.

First magnetic circuit is formed by first permanent magnet 53-1, first guide yoke 54-1 and first elongated yoke section 52-1 and second magnetic circuit is formed by second permanent magnet 53-2, second elongated yoke section 52-2 and second guide yoke 54-2. Therefore, a first magnetic field is produced in the Y-direction in a first gap space 55-1 between first permanent magnet 53-1 and guide yoke 54-1 and a second magnetic field is produced in the Y-direction in a second gap space 55-2 between second permanent magnetic 53-2 and second guide yoke 54-2. Disposed between guide yokes 54-1, 54-2 is head frame 40 which contains prism 76, mount 75, and other optical members. Over the head frame, objective lens 18 is mounted on objective-lens supporting member 61. Frame 40 is formed with opening 65 which, facing lens 18, secures an optical path between lens 18 and prism 76 fixed in frame 40. Supporting member 61 is fixed to saddle-shaped coil 57, which extends between the top faces of yokes 54-1, 54-2 and along the inside faces thereof, opposed to their corresponding magnets 53. Head frame 40 is supported by a pair of coils 59 which are wound around yokes 54-1, 54-2 to extend parallel to each other, and which serve to drive optical head 5. Coils 59 can move together with frame 40 along yokes 54-1, 54-2 or in the Y-direction. Coil 57 is coupled to coils 59 by means of spring members 62 so that objective lens 18 can move at least along its optical axis or in the Z-direction of FIG. 2. Coils 57 and 59, spring members 62, and lens supporting member 61 constitute carrier block 7, which carries the optical head 5.

Part of each head driving coil 59 extends in the Z-direction, within gap spaces 55-1, 55-2 of the magnetic circuit in which the magnetic field is generated in the Y-direction. When coils 59 are energized in response to an access signal from CPU 8, therefore, they are subjected to a transporting force in the X-direction. As a result, head frame 40, which is movable with coils 59, is transported in the X-direction along guide yokes 54-1, 54-2 to access a predetermined tracking guide. In an access mode, head frame 40 is substantially located under the predetermined tracking guide to be accessed.

In a tracking mode, coils 59 are energized in response to a tracking error signal from tracking-error signal generator 12 and head frame 40 is minutely vibrated so that objective lens 18 is directed to a predetermined tracking guide and the predetermined tracking guide is correctly traced by the laser beam.

Also, part of saddle-shaped coil 57 extends in the X-direction within gap spaces 55-1, 55,2. When coil 57 is energized in response to a focusing signal, therefore, it is subjected to a force in the Z-direction. Thereupon, lens 18, which is supported by spring members 62 to be movable with coil 57, is deviated at least in the Z-direction. Thus, lens 18 is moved so that it is maintained in a focusing state.

If a tracking-error is caused by deviation of optical disk 1 or the like, it is corrected by driving head frame 40. Such tracking-error correction requires high-band response, which can be attained by increasing the driving force or the number of turns of head driving coils 59, and reducing the weight of the moving parts. Since a common magnetic field is generated in gap spaces 55-1, 55-2, working forces for correcting focusing-errors in the Z-direction and tracking-errors in the X-direction can be produced efficiently. Thus, drive mechanism 51 can be made compact.

Since head frame 40 is disposed between yokes 54-1, 54-2, which are made of high-permeability material, leakage flux from gap spaces 55-1 or 55-2 can be prevented from reaching frame 40 or objective lens 18.

Figure 3:
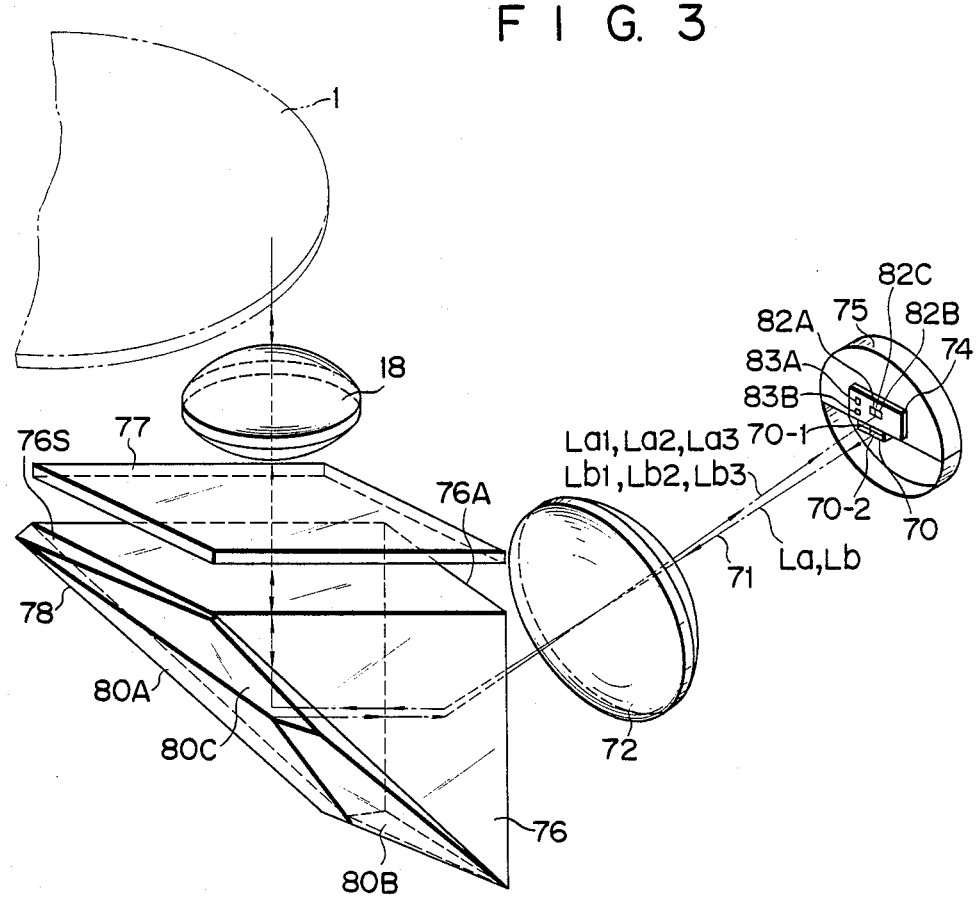
FIG. 3 is a perspective view schematically showing an optical system for the optical head of FIG. 2.

In optical head 5, as shown in FIG. 3, semiconductor laser array 70, having first and second laser structures 70-1 and 70-2 for emitting recording or retrieving laser beam La and erasing laser beam Lb, respectively, is disposed on the optical axis 71 of convex lens 72, which serves both as a collimator lens and a projection lens. The light emitting points of laser array 70 are located on the focal plane of lens 72. Photodetector 74 is disposed close to laser array 70. Laser array 70 and photodetector 74 are fixed on mount 75. Divergent laser beams La and Lb are emitted from laser emitting points of array 70. As they pass through lens 72, the beams are converted into collimated laser beams, and then projected on prism 76. Since prism 76 has its incidence surface 76A inclined relative to optical axis 71 of lens 72, the cross section of each collimated laser beam is changed from an elliptic shape to a circular one, as the beam incident on surface 76A is refracted. As they advance in prism 76, the laser beams are reflected by polarizing surface 76S on the opposite side of the prism. Then, after passing through quarter-wave plate 77, the laser beams are converged on optical memory 1 by objective lens 18.

If the erasing and recording laser beams are applied to the record layer of optical memory 1 in a recording mode, information is erased successively from the record layer by the erasing laser beam and new information is recorded on the erased region of the record layer by the recording laser beam. The information is recorded as a change of state of a domain on the record layer. In a retrieving mode, the retrieving laser beam is emitted only from first semiconductor laser structure 70-1, and is not emitted from second semiconductor laser structure 70-2. In an erasing mode, the erasing and retrieving laser beams are applied to the record layer so that the information is erased and unerasable permanent record data, e.g., a sector address or track address recorded as prepits, is retrieved by the retrieving laser beam.

The laser beams reflected by optical memory 1 are introduced into prism 76 through objective lens 18 and quarter-wave plate 77, and then returned to polarizing surface 76S. As the laser beams reciprocate through plate 77, their vibrating direction is rotated 90°. Thus, the beams are converted into linearly polarized laser beams by plate 77. Returned to surface 76S, the laser beams are transmitted through it to be introduced into prism member 78, which is coupled to surface 76S and serves to separate the beams.

Figure 4:
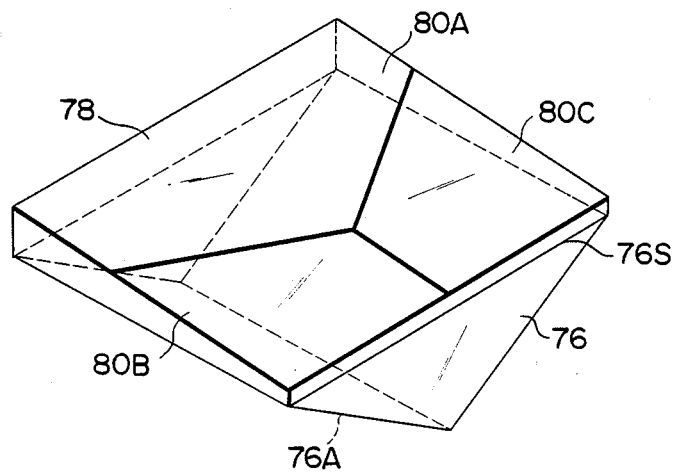
FIG. 4 is a perspective view showing a prism of the system shown in FIG. 3.

As shown in FIG. 3, prism member 76, which is disclosed in U.S. Pat. Appl. Ser. No. 862,829, filed on May 13, 1986, by Andō, has three total-reflection surfaces 80A, 80B and 80C which adjoin at a certain angle to one another extending nonparallel to polarizing surface 76S, as shown in FIG. 4. The boundary line between surfaces 80B and 80C extends substantially in the extending direction of the tracking guide on optical memory 1, or that of an image of the tracking guide projected on photodetector 74. Each of laser beams La and Lb, reflected by total-reflection surfaces 80A, 80B and 80C, are separated into first, second and third laser beams La1, La2 and La3, or Lb1, Lb2 and Lb3, each being directed differently. Then, the beams pass again through polarizing surface 76S to be incident on convex lens 72. Lsser beams La1, La2, La3, Lb1, Lb2 and Lb3 are directed to photodetector 74. First laser beams La1 and Lb1, reflected by reflecting surface 80A, are converged on a pair of photosensitive regions 82A and 82B for focusing-error detection. Second and third laser beams La2, La3, Lb2 and Lb3, reflected by reflecting surfaces 80B and 80C, respectively, are converged on a pair of photosensitive regions 83A and 83B arranged separately, for detecting a tracking error from a diffraction pattern which is produced when the laser beam is diffracted by the tracking guide.

In the optical system described above, the focusing error and tracking error are detected by the knife-edge method and push pull method, respectively. Refer to detailed descriptions in U.S. Pat. Nos. 4,585,933 and 4,546,460 and U.S. patent application Ser. No. 817,259, by Andō, for the respective principles of these two methods.

First recording or retrieving laser beam La1, reflected by reflecting surface 80A and picked up, is deflected as objective lens 18 is moved along its optical axis. If lens 18 is in a focusing state, first laser beam La1 is directed to photo-insensitive region 82C between photosensitive regions 82A and 82B, as shown in FIG. 5. If lens 18 is in a defocusing state, on the other hand, beam La1 is directed to either region 82A or 82B.

In the retrieving mode, retrieving laser beam La is emitted only from first laser beam emitting point 70-1, so that only first retrieving laser beam La1 is reflected by reflecting surface 80B. In the erasing or recording mode, however, recording or retrieving laser beam La and erasing laser beam Lb are emitted from first and second semiconductor laser structures 70-1 and 70-2, so that first recording or retrieving laser beam La1 and first erasing laser beam Lb1 are reflected by reflecting surface 80A. Laser beam Lb1, like laser beam La1, is directed to one of photosensitive regions 80A and 80B. Thus, even though objective lens 18 is in the focusing state, beam spot Sb1, besides beam spot Sa1 on the photo-insensitive region 80C between photosensitive regions 80A and 80B, is formed on one of regions 80A and 80B by laser beam Lb1. A signal from one of regions 80A and 80B, produced by beam spot Sb1, is corrected by correction circuit 98 of focusing-error signal generator 20 in the following stage. Thus, objective lens 18 is always kept in the focusing state by a focusing-error signal delivered from generator 20.

The tracking guide is detected from the location of diffraction patterns which are produced in beam spot Sa2 formed on photosensitive regions 83A and 83B by second and third recording or retrieving laser beams La2, Lb2, La3, Lb3, which are reflected from reflecting surfaces 80B, 80C. If lens 18 is directed toward a desired track so that the track is traced correctly with laser beams La and Lb, diffraction patterns of equal areas are produced in laser beam spots Sa2, Sb2 and Sa3, Sb3 on photosensitive regions 83A and 83B. As a result, photoelectric signals of equal levels are delivered from regions 83A and 83B. Accordingly, a differential amplifier (not shown) produces a tracking-error signal of a zero level, which indicates that the track is traced correctly with the laser beam. If the track is not traced correctly, diffraction patterns of different areas are produced in laser beam spots Sa2, Sb2 and Sa3, Sb3 on regions 83A and 83B. As a result, photoelectric signals of different levels are delivered from regions 83a and 83B. Accordingly, the amplifier produces a tracking-error signal of a plus or minus level, which indicates that the desired track is not traced correctly.

Example of correction circuit 98 will now be described in detail with reference to FIG. 5. It serves to correct the signal from one of photosensitive regions 80A and 80B produced by beam Sb1.

In the retrieving mode, only the retrieving laser beam La is emitted, so that only beam spots Sa1, Sa2, and Sa3 are formed on photodetector 74, while beam spots Sb1, Sb2, Sb3 are absent. Photoelectric signals delivered from photosensitive regions 82A and 82B are supplied to preamplifiers 90A, 90B and added by a adder 92. The added signal is converted into a digital signal by A/D converted 93, and is supplied to CPU 8. Since beam spots Sb1, Sb2 and Sb3 are absent in the retrieving mode, adder 92 delivers the added signal of a level lower than in the case of the erasing mode. Accordingly, CPU 8 delivers no correction signal to D/A converter 94. Thus, photoelectric signals from photosensitive regions 82A, 82B are supplied to differential amplifier 95 through preamplifiers 90C, 90D without being corrected, so that a focusing-error signal is delivered from amplifier 95.

In the recording or erasing mode, beam spots Sb2 and Sb3, as well as beam spots Sa2 and Sa3, are formed on photosensitive regions 82A and 82B. Therefore, adder 92 delivers a summation signal of a level higher than in the case of the retrieving mode. The summation signal is applied to CPU 8 through A/D converter 93, and the level of a correction signal is determined by the summation signal in accordance with ratio data supplied from memory, i.e., ROM 17. The correction signal is supplied to adder 96 through D/A converter 94. Since the level of the correction signal is substantially equal to that of a signal into which beam spot Sb1 in photosensitive region 16B is converted, differential amplifier 23 delivers an accurate focusing-error signal.

The level of the correction signal is determined by CPU 8 on the basis of the summation signal from adder 92, which varies as the reflection factor of the region on the optical disk. Thus, CPU 8 can deliver a correction signal of a level accurately or essentially equivalent to the intensity level of beam spot Sb1.

In the optical system shown in FIG. 3, incidence surface 76A of prism 76 is inclined relatively to optical axis 71 of convex lens 72. Therefore, the cross section of the collimated laser beam is changed from an elliptic shape to a circular one as the beam incident on surface 76A is refracted. Also, the laser beam, reflected by the reflecting surface of prism 76 and directed to convex lens 72, is refracted by surface 76A. Thus, the cross-sectional shape of the beam is changed and the beam diameter is increased substantially. As the beam diameter is increased in this manner, the image magnification of the optical system is enlarged, so that the focusing-error sensing capability of the system can be improved, as disclosed in U.S. Pat. Appl. Ser. No. 742,396, filed on Jun. 7, 1985, by Ando. Especially in the optical system using the knife-edge method, as shown in FIG. 3, the laser beam is elongated in the direction of deflection in accordance with the size of tracking error. Accordingly, the susceptibility of the laser beam to deflection is increased, so that the focusing-error sensing capability of the system is improved particularly.

Figure 6:
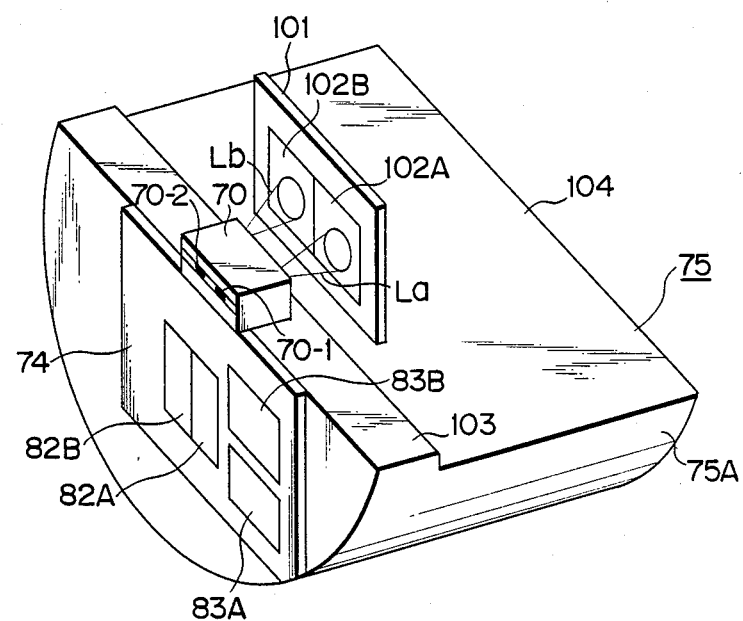
FIG. 6 is a perspective view showing an arrangement of a mount and electronic components on the mount as shown in FIG. 3.

As shown in FIGS. 5 and 6, mount 75 is in the form of a cylindrical part rotatable in the direction of arrow I. The center of rotation of mount 75 is in alignment with the optical axis of convex lens 72, so that the first light emitting point of semiconductor laser array 70 is located on the center of mount 75 and at a focal plane of convex lens 72. Thus, even though mount 75 is rotated, the laser beam can travel in an optical path along a fixed optical axis. If mount 75 is rotated in direction I, photosensitive regions 82A and 82B for focusing-error detection are rotated in the same direction. Namely, first recording and retrieving laser beam La is focused on a predetermined point when objective lens 18 is in the focusing state, and photosensitive regions 82a and 82B can be moved to the predetermined point when mount 75 is rotated in direction I. In other words, the beam spot is moved substantially in the circumferential direction of mount 75, on regions 82A and 82B. In assembling or adjusting optical head 5, therefore, the optical system for focus detection can be adjusted easily by rotating mount 75 so that the beam spot is formed on the photosensitive region between regions 82a and 82B while keeping objective lens 18 in the focusing state. In adjusting the optical system for tracking-guide detection, polarizing prism 76 is shifted along a ridge line between first and second surfaces 80A and 80B, so as to form the beam spot equally distributed on photosensitive regions 83A and 83B for tracking-guide detection while keeping lens 18 in the focused state. First laser beam spots Sa1 and Sb1 are not shifted on photodetector 74, and only second and third laser beam spots Sa2, Sb2, and Sa3 and Sb3 are shifted in a direction along which regions 83A and 83B are arranged. Thereupon, objective lens 18 is maintained in the focusing state, and polarizing prism 76 is shifted along the ridge line between first and second reflecting surfaces 80A and 80B. To facilitate the adjustment of the optical system, mount 75 and convex lens 72 are supported by a lens barrel (not shown) for joint rotation.

The apparatus for energizing a semiconductor laser array will be explained below with reference to FIGS. 6 and 7.

Semiconductor array 70, which emitted laser beams from its front and rear sides, is placed on flat-stepped surface 103 of semi-cylindrical base 75A of mount 75 as shown in FIG. 6. On flat surface 104 of semicylindrical base 75A extending behind semiconductor array 70, photodetector 101 is located having photosensitive region 102A and 102B for monitoring a retrieving or recording laser beam and an erasing laser beam, respectively, which are generated from the rear side of first and second semiconductor laser structures 70-1 and 70-2 of semiconductor array 70.

In the semiconductor array, a ratio of the front laser beam emitted from its front side to the rear laser beam emitted from the rear side is constant and the front laser beam is maintained in a stable manner when the rear laser beam is monitored and controlled.

Semiconductor laser array 70 contains two semiconductor laser structures with their spot-to-spot (optical spot) distance determined within a range of usually 3 to 1000 μm, preferably within a range of usually 3 to 160

μm and more preferably within a range of usually 30 to 60 μm. The aforementioned values are determined for reasons as set forth below. For the lower limit value of 3 μm or 3 to 4 μm, cross-talk may occur between the contiguous semiconductor laser structures in which case it is difficult to suppress the cross-talk or to align only one optical spot with optical axis 71 of the optical system. For the upper limit value of above 1000 μm, beam spots are formed on optical disk 1 with a greater distance left between the beam spots, in which case there is a risk that the beam spots will never be guided simultaneously by the tracking guide. In this connection, it is to be noted that the upper limiting value of 160 μm is determined as a limit value, taking into consideration the effective field of view of convex lens 72 and image magnification of the optical system in order to form a beam spot diameter of 1 μm on optical disk 1. With various considerations given to the aforementioned aspects, the most preferable range is set within 30 to 60 μm.

Figure 7:
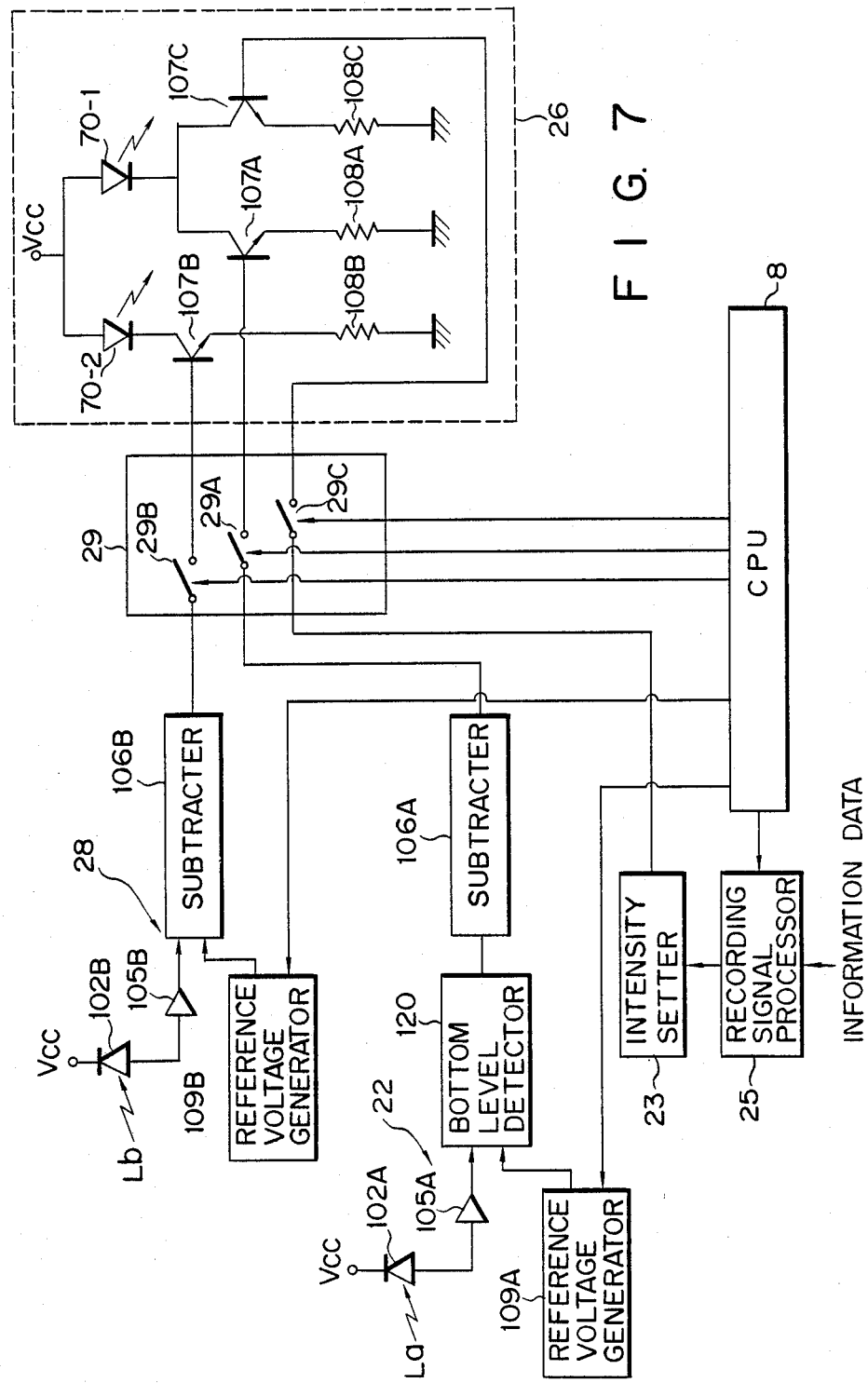
FIG. 7 is a circuit arrangement showing one form of a circuit for energizing the semiconductor laser as shown in FIG. 6.

FIG. 7 is a circuit arrangement showing the apparatus for energizing a laser array.

First photosensitive region 102A connected to a power supply Vcc is connected through preamplifier 105A (current/voltage converting circuit) and bottom level detector 120 to first subtracter 106A, which is connected to reference voltage generator 109A. First subtracter 106A is connected through first switch 29A of analog switch 298 to the base of first NPN transistor 107A. First NPN transistor 107A has its emitter grounded through resistor 108A and its collector connected to the power supply Vcc through first semiconductor laser structure 70-1. Similarly, second photosensitive region 102B connected to the power supply voltage Vcc is connected through preamplifier 105B (current/voltage converting circuit) to second subtracter 106B, which is connected to reference voltage generator 109B for generating a reference voltage. Second subtracter 106B is connected to the base of second NPN transistor 107B through second switch 29B in analog switch 29. Second NPN transistor 107B has its emitter grounded through resistor 108B and its collector to power supply Vcc through second semiconductor laser structure 70-2. Intensity setter 23 is connected to receive a recording signal from recording signal processor 25 and connected to the base of third NPN transistor 107C through third switch 29C in analog switch 29. Third NPN transistor 107C has its emitter grounded through resistor 108C and its collector connected to the power supply Vcc through first semiconductor laser structure 70-1.

In the retrieving mode, switch 29A is closed upon receipt of a retrieving mode signal from CPU 8 and, at the same time, the reference voltage generator starts to generate the reference voltage. Thus, the reference voltage is supplied to the base of first transistor 107A, causing first transistor 107A to be turned ON so that first semiconductor laser structure 70-1 is energized with the power supply voltage (Vcc). The retrieving laser beam is emitted from the front and rear sides of first semiconductor laser structure 70-1. The retrieving laser beam emitted from the rear surface side is introduced into corresponding photosensitive region 102A so that the retrieving laser beam from first semiconductor laser 70-1 is detected. The photoelectric signal which is detected at photosensitive region 102 is converted by preamplifier 105A to a voltage signal. In this case, a voltage difference between the voltage signal and the reference voltage is supplied as an operation signal to the base of transistor 107A, whose internal impedance varies in accordance with the level of the voltage supplied to the base of transistor 107A so that, the greater the voltage level, the smaller the internal impedance that is maintained. As a result, just at the start of the retrieving mode, the reference voltage is applied directly to the base of transistor 107A at which time the internal impedance of transistor 107A is lowered. When the retrieving laser beam is generated from first semiconductor laser structure 70-1, the difference signal is supplied to the base of transistor 107A, resulting in a greater impedance in transistor 107A. In accordance with the voltage signal to which the corresponding signal detected at photosensitive region 102A is converted by preamplifier 105A, the internal impedance of transistor 107A is adjusted, causing a variation in the current amplification factor so that the intensity of the retrieving laser beam from first semiconductor laser 70-1 is maintained invariably constant.

In the recording mode, switches 29A, 29B and 29C are closed and, at the same time, reference voltage generators 109A and 109B start to generate reference voltages. As a result, the reference voltages are applied to the bases of first and second transistors 107A and 107B, turning first and second transistors 107A and 107B ON. A modulation signal from intensity setter 23 is supplied through switch 29C to the base of transistor 107C, causing transistor 107C to be turned ON and OFF. The first laser structure is energized by first transistor 107A, which has been turned ON with the reference voltage. A current which is intensitymodulated in accordance with a recording signal is supplied from transistor 107C to the first laser structure so that an optically intensity-modulated recording laser beam having a relatively large intensity is generated from the first laser structure. Second semiconductor laser structure 70-2 is energized by the turned-ON second transistor 107B, generating an erasing laser beam having an intermediate intensity level between the level of the recording laser beam and that of the retrieving laser beam. The erasing and recording laser beams emitted from the rear of second semiconductor laser structure 70-2 are introduced into the oppositely facing photosensitive regions 102A and 102B to allow the erasing and recording laser beams from first and second semiconductor laser structures 70-1 and 70-2 to be detected. The photoelectric signal detected at photosensitive region 102B is converted by preamplifier 105B to a voltage signal, and a difference voltage between the voltage signal and the reference voltage is supplied as an operation signal to transistor 107B. Not only in the retrieving mode but also in the recording mode, the internal impedance of transistor 107B is adjusted in accordance with a voltage signal to which the corresponding signal detected at photosensitive region 102B is converted by preamplifier 105B. As a result, the intensity of the erasing laser beam generated from second semiconductor structure 70-2 is maintained invariably constant. In the recording mode, the photoelectric signal detected by photosensitive region 102A is converted by preamplifier 105A to a voltage signal which has a bias level corresponding to the retrieving laser beam and a modulated level corresponding to the recording laser beam.

The voltage signal is supplied to bottom level detector 120 and is filtered by bottom level detector 120 so that the modulated level component of the voltage signal is removed and the bias level component of the voltage signal is outputted from bottom level detector 120 to subtracter 106A. That is, the bottom level detector 120 is operated in the recording mode and processes the voltage signal to remove a pulse component having a high level and to pick up a D.C. component having a low level which is same as the voltage signal generated in the retrieving mode.

A difference voltage between that bias level component and the reference voltage is supplied as a subtraction signal from subtracter 106A to the base of transistor 107A. Hence not only in the retrieving mode but also in the recording mode, the internal impedance of transistor 107A is adjusted in accordance with the voltage signal to which the corresponding signal detected at photosensitive region 102A is converted by preamplifier 105A. As a result, the intensity of recording laser beam from first semiconductor laser structure 70-1 is maintained invariably constant.

In the erasing mode, only switch 29B is closed and the internal impedance of transistor 107B is adjusted in accordance with the voltage signal detected at photosensitive region 102B as in the recording mode, so that the intensity of the erasing laser beam from second semiconductor laser structure 70-2 is adjusted as to be maintained invariably constant.

Figure 8:
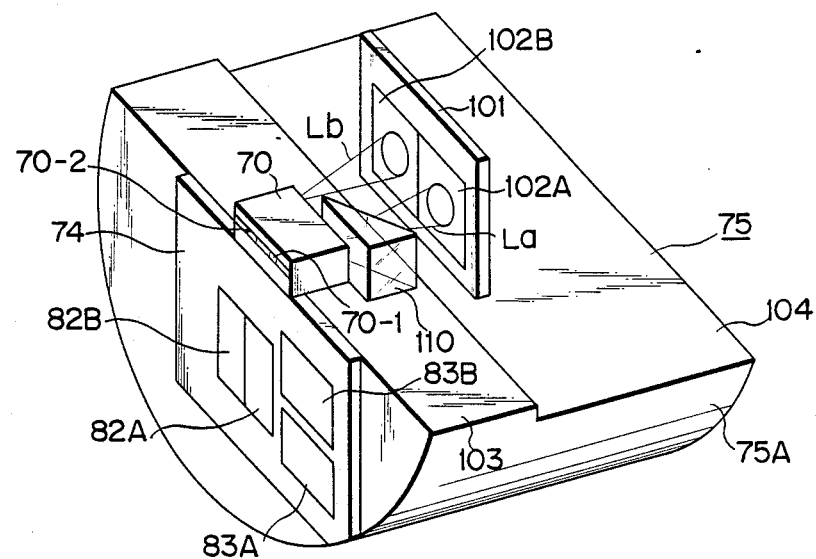
FIG. 8 is a perspective view showing another form of an arrangement of a mount and electronic component parts on the mount.

In semiconductor laser array 70 as set out above, a smaller distance is left between the beam emitting points of structures 70-1 and 70-2 and, in the optical system as shown in FIG. 6, it is not easier to align photodetector 102 with semiconductor laser array 70 so that the first and second laser beams from first and second laser structures 70-1 and 70-2 in semiconductor laser array 70 are accurately aligned with and conducted to photosensitive regions 102A and 102B in photodetector 102. To this end, prism 110 is located, as shown in FIG. 8, between one of first and second laser structures 70-1 and 70-2 in semiconductor laser array 70 and a corresponding one of photosensitive regions 102A and 102B in photodetector 102. In the arrangement as shown in FIG. 8, prism 110 is located between first laser structure 70-1 in semiconductor laser array 70 and photosensitive region 102A in photodetector 102. As a result, a divergent laser beam emitted from the rear of second laser structure 70-2 is introduced directly into photosensitive region 102B in photodetector 102, whereas a divergent laser beam emitted from the rear of first laser structure 70-1 in semiconductor laser array 70 is incident onto prism 110 where it is refracted with its sense oriented away from the divergent laser beam as emitted from the rear of second laser structure 70-2 in the semiconductor laser array 70 and then is introduced into photosensitive region 102A in photodetector 102.

In the arrangement shown in FIG. 8, even if the angle of divergence at which the laser beams are emitted from first and second laser structures 70-1 and 70-2 is large, it is possible to locate photodetector 102 away from semiconductor laser array 70. It is also possible to broaden the spacing between photosensitive regions 102A and 102B in photodetector 102. Even if a smaller spacing is left between the emitting points of laser structures 70-1 and 70-2 in semiconductor laser array 70, it is still possible to readily align photodetector 102 with semiconductor laser array 70.

Figure 9:
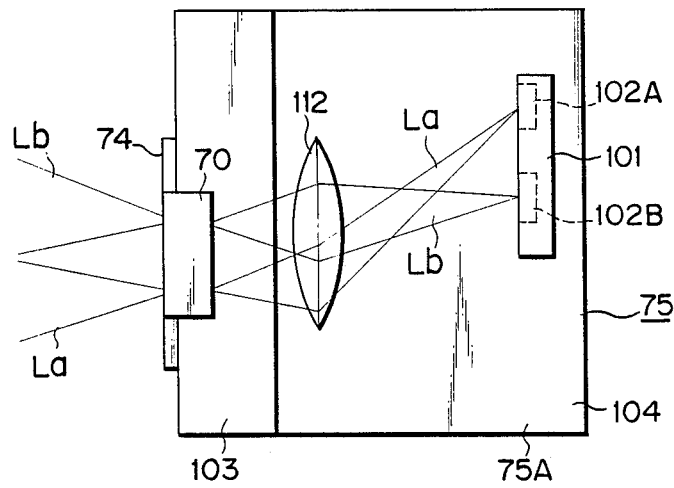
FIGS. 9 and 10 are plan views showing additional forms of an arrangement of a mount and electronic component parts on the mount.

It may be possible to replace the arrangement of FIG. 8 with that of FIG. 9. In the arrangement shown in FIG. 9, convex lens 112 may be located, in place of prism 110, between semiconductor laser array 70 and photodetector 102. Divergent laser beams emitted from the rear of first and second laser structures 70-1 and 70-2 enter convex lens 112 where they are directed as convergent beams to photosensitive regions 102A and 103B in photodetector 102. In the arrangement shown in FIG. 8, images from the emitting points of first and second laser structures 70-1 and 70-2 are formed as enlarged images on photosensitive regions 102A and 102B in photodetector 102, respectively. As a result, even if a smaller spacing is left between the emitting points of first and second laser structure 70-1 and 70-2, it is possible to enlarge the distance between photosensitive regions 102A and 102B in photodetector 102 to a distance determined by an image formation lateral magnification of convex lens 112. It is possible to locate photodetector 102 a proper distance away from semiconductor laser array 70 by appropriately selecting the focal distance of convex lens 112. It is, therefore, possible to readily align photodetector 102 with semiconductor laser array 70 even if a smaller distance is left between the beam emitting points of laser structures 70-1 and 70-2 in semiconductor laser array 70.

Figure 10:
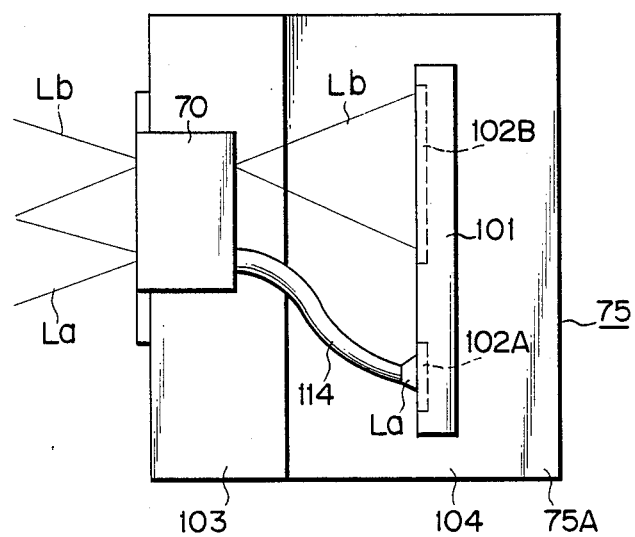

As shown in FIG. 10, first laser structure 70-1 of semiconductor laser array 70 may be optically coupled to corresponding photosensitive region 102A in photodetector 102. In this arrangement, a laser beam emitted from the rear of second laser structure 70-2 in semiconductor laser array 70 is incident also photosensitive region 102B of photodetector 102 through a gap between semiconductor laser array 70 and photodetector 102, whereas a laser beam emitted from the rear of first laser structure 70-1 in semiconductor laser array 70 enters photosensitive region 102A of photodetector 102 through an optical fiber 114.

In the arrangement shown in FIG. 10, photodetector 102 can be located away from semiconductor laser array 70 so as to broaden the distance between photosensitive regions 102A and 102B in photodetector 102. Thus it is possible to readily align photodetector 102 with semiconductor laser array 70 even if a smaller distance is left between the light beam points of laser structures 70-1 and 70-2 in semiconductor laser array 70.

The apparatus for energizing the semiconductor laser in accordance with the invention enables a laser beam to be stably generated from a plurality of light beam emitting points of the semiconductor laser structure.

What is claimed is:

1. An apparatus comprising:
light source means for generating first and second light beams, said light source means having first and second surfaces, a first portion of each of the first and second light beams being transmitted from said first surface and a second portion of each of the first and second light beams being transmitted from said second surface;
detecting means optically coupled to said light source means for detecting the first portion of the first and second light beams, said detecting means having a first detecting region for converting the first portion of the first light beam to a first electric signal and a second detecting region for converting the first portion of the second light beam to a second electric signal;
means responsive to said detecting means for generating first and second energizing signals in accordance with the first and second electric signals, respectively; and means for controlling the intensities of the first and second light beams in accordance with the first and second energizing signals.

2. The apparatus according to claim 1, wherein said means for generating the first and second energizing signals comprises:

means for generating a first reference signal;

first comparing means for comparing the first electric signal with the first reference signal to generate the first energizing signal;

means for generating a second reference signal; and second comparing means for comparing the second electric signal with the second reference signal to generate the second energizing signal.

3. The apparatus according to claim 1, further comprising means, located between said light source means and said detecting means, for directing at least one of the first and second light beams to cause the first portions of the first and second light beams to be directed away from one another.

4. The apparatus according to claim 3, wherein said directing means includes a prism located between said first detecting region and said light source means.

5. The apparatus according to claim 3, wherein said directing means includes an optical fiber for optically coupling said first detecting region to said light source means.

6. The apparatus according to claim 3, wherein said directing means includes a lens located between said detecting means and said light source means for directing the first portions of the first and second light beams to said first and second detecting regions, respectively.

7. The apparatus according to claim 1, wherein the first portion of the first light beam is transmitted in a direction opposite to that of the second portion of the first light beam and the first portion of the second light beam is transmitted in a direction opposite to that of the second portion of the second light beam.

* * * * *